United States Patent
Yun et al.

(10) Patent No.: US 8,339,872 B2
(45) Date of Patent: Dec. 25, 2012

(54) SEMICONDUCTOR MEMORY APPARATUS AND METHOD OF DRIVING BIT-LINE SENSE AMPLIFIER

(75) Inventors: Tae-Sik Yun, Gyeonggi-do (KR); Jae-Jin Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 289 days.

(21) Appl. No.: 12/648,983

(22) Filed: Dec. 29, 2009

(65) Prior Publication Data

US 2011/0075491 A1   Mar. 31, 2011

(30) Foreign Application Priority Data

Sep. 30, 2009   (KR) .................. 10-2009-0093577

(51) Int. Cl.
*G11C 7/00* (2006.01)
*G11C 7/02* (2006.01)
*G11C 5/14* (2006.01)
(52) U.S. Cl. .................. 365/189.11; 365/207; 365/226; 365/205
(58) Field of Classification Search .................. None
See application file for complete search history.

(56) References Cited

U.S. PATENT DOCUMENTS

| 5,966,337 | A | * | 10/1999 | Lee et al. | ............. | 365/203 |
| 6,347,058 | B1 | | 2/2002 | Houghton et al. | | |
| 6,459,639 | B2 | * | 10/2002 | Nishimura | ............. | 365/207 |
| 7,020,043 | B1 | | 3/2006 | Lee | | |
| 7,038,957 | B2 | | 5/2006 | Kwack et al. | | |
| 7,158,430 | B2 | | 1/2007 | Byun | | |
| 7,813,200 | B2 | * | 10/2010 | Seo | ............. | 365/205 |
| 2004/0240291 | A1 | * | 12/2004 | Kang | ............. | 365/205 |
| 2006/0267630 | A1 | | 11/2006 | Matsui | | |
| 2006/0268630 | A1 | | 11/2006 | Park et al. | | |
| 2007/0070746 | A1 | * | 3/2007 | Han | ............. | 365/203 |

FOREIGN PATENT DOCUMENTS

| JP | 11-273346 | 10/1999 |
| JP | 2006-286163 | 10/2006 |
| JP | 2006-309916 | 11/2006 |
| KR | 10-1999-0075833 | 10/1999 |
| KR | 1020070036576 | 4/2007 |

* cited by examiner

*Primary Examiner* — Hoai V Ho
*Assistant Examiner* — James G Norman
(74) *Attorney, Agent, or Firm* — Venable LLP; Jeffri A. Kaminski

(57) ABSTRACT

Disclosed is a semiconductor memory apparatus which improves the time to transmit write data to a memory cell and improves data retention time of the memory cell. To this end, the semiconductor memory apparatus includes a bit-line sense amplifier that senses and amplifies data of bit-line pairs by driving power supplied through a pull up power line and a pull down power line and transmits the amplified data to a memory cell. A bit-line sense amplification power supply unit supplies pull up driving voltage and pull down driving voltage to the pull up and pull down power lines in an active mode and supplies an over driving voltage and the pull down driving voltage having a higher voltage level than the pull up driving voltage to the pull up and pull down power lines until the memory cell is deactivated in a precharge mode.

6 Claims, 4 Drawing Sheets

SEMICONDUCTOR MEMORY APPARATUS AND METHOD OF DRIVING BIT-LINE SENSE AMPLIFIER

CROSS-REFERENCES TO RELATED PATENT APPLICATION

The present application claims priority under 35 U.S.C 119(a) to Korean Application No. 10-2009-0093577, filed on Sep. 30, 2009, in the Korean Intellectual Property Office, which is incorporated herein by reference in its entirety as set forth in full.

BACKGROUND

1. Technical Field

Embodiments of the present invention relates to a semiconductor memory apparatus, and in particular, to a technology for transmitting data to a memory cell.

2. Related Art

A dynamic random access memory (DRAM) among semiconductor memory apparatuses is a typical volatile memory. A memory cell of the DRAM includes a cell transistor and a cell capacitor. The cell transistor plays a role of controlling an access to the cell capacitor and the cell capacitor plays a role of storing charges corresponding to data. In other words, the data are classified into a high-level data or a low-level data according to the charge amount stored in the cell capacitor.

Meanwhile, the charges are input and output to and from the cell capacitor using a leakage component and thus, the memory cell of the DRAM should periodically store the corresponding data. As described above, a periodically performed operation in order to accurately maintain the data is referred to as a refresh operation.

The memory cell of the DRAM is activated in an active mode and the bit-line sense amplifying circuit senses and amplifies data transmitted from the activated memory cell and transmits them to the memory cell again. In addition, the memory cell is deactivated in the precharge mode to maintain the data. In other words, it can be said that the refresh operation repeatedly performs the active operation and the precharge operation at a predetermined period.

Meanwhile, when the leakage component is increased, a data retention time for the memory cell to reliably maintain the data after the precharge operation becomes short and thus, a technology to improve this has been needed.

SUMMARY

In one embodiment of the present invention, a semiconductor memory apparatus includes: a bit-line sense amplifier configured to sense and amplify data of bit-line pairs by driving power supplied through a pull up power line and a pull down power line and transmits the amplified data to a memory cell; and a bit-line sense amplification power supply unit configured to supply pull up drive voltage and pull down drive voltage to the pull up and pull down power lines in an active mode and supply an over drive voltage having a higher voltage level than the pull up drive voltage and the pull down drive voltage to the pull up and pull down power lines until the memory cell is deactivated in a precharge mode.

In another embodiment of the present invention, a semiconductor memory apparatus includes: a bit-line sense amplifier configured to sense and amplify data of bit-line pairs by driving power supplied through a pull up power line and a pull down power line and transmit the amplified data to a memory cell; and a bit-line sense amplification power supply unit configured to supply pull up drive voltage and pull down drive voltage to the pull up and pull down power lines in a data write mode and supply an over drive voltage having a higher voltage level than the pull up drive voltage and the pull down drive voltage to the pull up and pull down power lines until the memory cell is deactivated in a precharge mode.

In yet another embodiment of the present invention, a method for driving a bit-line sense amplifier of a semiconductor memory apparatus includes: sensing and amplifying read data of a memory cell transmitted through a bit-line in an active mode and transmitting the data to the memory cell by a drive voltage corresponding to the read data; and transmitting the data to the memory cell using an over drive voltage having a higher voltage level than the drive voltage until the memory cell is deactivated in a precharge mode.

In still another embodiment of the present invention, a method for driving a bit-line sense amplifier of a semiconductor memory apparatus includes: transmitting data to a memory cell by a drive voltage corresponding to the write data in a data write mode; and transmitting the data to the memory cell by an over drive voltage having a higher voltage level than the drive voltage until memory cell is deactivated in a precharge mode.

In still yet another embodiment of the present invention, a method for driving a bit-line sense amplifier of a semiconductor memory apparatus includes: activating a pull up over drive power drive signal for a predetermined time in response to a precharge command; and supplying an over drive voltage having a higher voltage level than the pull up drive voltage to the pull up power line for the activation period of the pull up over drive power drive signal.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Hereinafter, embodiments of the present invention will be described in detail with reference to the accompanying drawings so that those skilled in the art may easily implement the spirit of the present invention.

Figure 1:
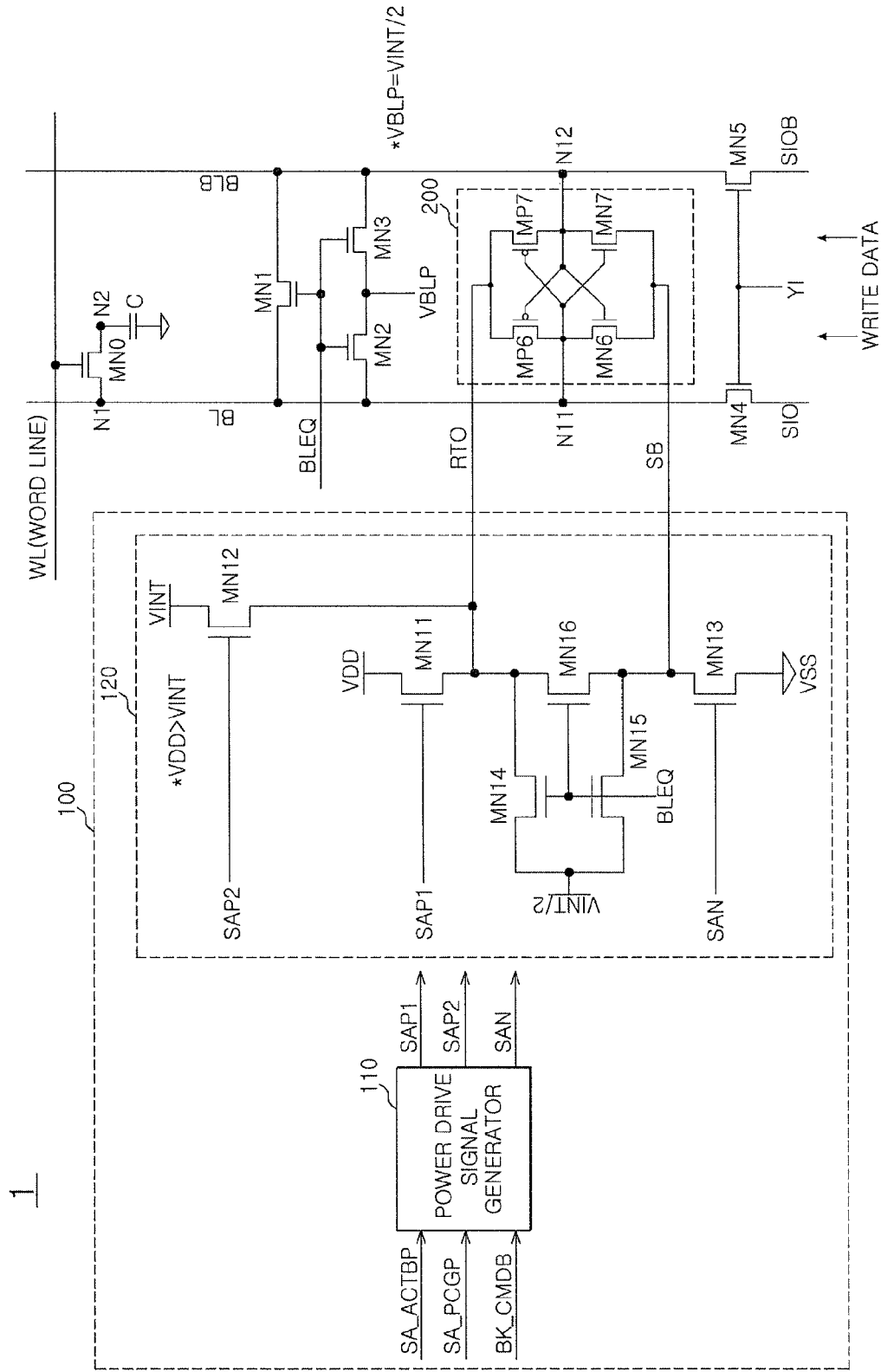
FIG. 1 is a diagram showing a configuration of a semiconductor memory apparatus according to an embodiment.

FIG. 1 is a diagram showing a configuration of a semiconductor memory apparatus according to an embodiment.

The semiconductor memory apparatus according to the embodiment includes a simple configuration for clearly describing only the technical spirit to be proposed in the present invention. For reference, data stored in a semiconductor memory apparatus 1 are classified into a high level (H) or a low level (L) corresponding to a voltage level and are represented by '1' and '0', etc. At this time, data values are differentially classified according to a voltage level and a current amount and in the case of binary data, the high level is defined by a high voltage and the low level is defined by a lower voltage than a high level.

Referring to FIG. 1, the semiconductor memory apparatus 1 includes a bit-line sense amplification power supply unit 100 and a bit-line sense amplification unit 200.

The bit-line sense amplification unit 200 senses and amplifies data of a bit-line pair 'BL' and 'BLB' by a driving power supplied through a pull up power line 'RTO' and a pull down power line 'SB' and transmits the amplified data to memory cells 'MN0' and 'C'. The bit-line sense amplification unit 200 is a cross couple latch amplifier that is configured to include a plurality of PMOS transistors 'MP6' and 'MP7' and a plurality of NMOS transistors 'MN6' and 'MN7'. Therefore, the voltage of the bit-line pair 'BL' and 'BLB' connected to differential input and output terminals 'N11' and 'N12' is sensed and amplified by the driving power.

The bit-line sense amplification power supply unit 100 supplies a pull up drive voltage 'VINT' and a pull down drive voltage 'VSS' to the pull up and pull down power lines 'RTO' and 'SB' in an active mode and supplies an over drive voltage 'VDD' having a higher voltage level than the pull up drive voltage 'VINT' and the pull down drive voltage 'VSS' to the pull up and pull down power lines 'RTO' and 'SB' until the memory cell 'MN0' and 'C' is deactivated in a precharge mode. For reference, the bit-line sense amplification power supply unit 100 may supply the over drive voltage 'VDD' to the pull up power line 'RTO' for an initial predetermined period of the active mode.

In addition, the bit-line sense amplification power supply unit 100 supplies the pull up drive voltage 'VINT' and the pull down drive voltage 'VSS' to the pull up and pull down power lines 'RTO' and 'SB' in a data write mode. In addition, the bit-line sense amplification power supply unit 100 that supplies a precharge voltage 'VINT/2' to the pull up and pull down power lines 'RTO' and 'SB' after the memory cells 'MN0' and 'C' is deactivated in the precharge mode.

For reference, in the semiconductor memory apparatus 1, the memory cells 'MN0' and 'C' are activated in the active mode. At this time, the bit-line sense amplifier 200 senses and amplifies the data transmitted from the activated memory cells 'MN0' and 'C' and transmits them to the memory cells 'MN0' and 'C' again.

In addition, the memory cell 'MN0' and 'C' is deactivated in the precharge mode to maintain the data. At this time, the bit-line pair 'BL' and 'BLB' is precharged to the precharge voltage 'VINT/2' by bit-line precharge units 'MN1', 'MN2', and 'MN3'. In the semiconductor memory apparatus 1 of the embodiment, the bit-line sense amplifier 200 drives the bit-line pairs 'BL' and 'BLB' by the over drive voltage 'VDD' and the pull down drive voltage 'VSS' until the memory cells 'MN0' and 'C' are deactivated in the precharge mode Therefore, if it is assumed that high-level data are stored in the memory cells 'MN0' and 'C' and the bit-line sense amplifier 200 amplifies the high-level data and transmits them to the memory cells 'MN0' and 'C', the memory cells 'MN0' and 'C' receives data by the over drive voltage 'VDD' that has a higher level than the pull up drive voltage 'VINT' immediately before the memory cells 'MN0' and 'C' are deactivated, thereby improving a data retention time in the deactivated state.

In addition, in the data write mode, the memory cells 'MN0' and 'C' is activated and the data transmitting transistors 'MN4' and 'MN5' are turned-on to transmit the write data to the bit-line pairs 'BL' and 'BLB'. At this time, the bit-line sense amplifier 200 senses and amplifies the write data of the bit-line pair 'BL' and 'BLB' and transmits them to the memory cells 'MN0' and 'C'. At this time, if it is assumed that the high-level write data is transmitted, the bit-line sense amplifier 200 transmits the write data to the memory cells 'MN0' and 'C' by the pull up drive voltage 'VINT'. Thereafter, the memory cells 'MN0' and 'C' receives the data by the over drive voltage 'VDD' having a higher level than the pull up drive voltage 'VINT' immediately before they are deactivated in the precharge mode. Thereby, after a time point when the data write command is applied, a time 'Twr', which can apply the precharge command, can be shortened. In particular, the high-level data consumes a longer write time than the low-level data. On the other hand, the write time of the high-level data is shortened through the present scheme, thereby improving the data write time. In addition, the time to maintain the data is improved in the state where the memory cells 'MN0' and 'C are deactivated.

The activation of the memory cells 'MN0' and 'C' means that the cell transistor 'MN0' is turned-on by the control voltage transmitted through a word line 'WL' to electrically connect between the cell capacitor 'C' and a positive bit-line 'BL'. In addition, the deactivation of the memory cells 'MN0' and 'C' means that the cell transistor 'MN0' is turned-off. Further, the semiconductor memory apparatus 1 enters the corresponding operation mode by an active command, a precharge command, a data write command. In generally, it substantially enters the corresponding operation mode after a predetermined time from a command applying time point. In addition, the semiconductor memory apparatus 1 applies the data write command or the data read command between the active command and the precharge command, to perform the data write operation or the data read operation.

Meanwhile, the bit-line sense amplification power supply unit 100 is configured to include a power drive signal generator 110 and a power supply driver 120.

The power supply drive signal generator 110 generates a pull up power drive signal 'SAP2', a pull down power drive signal 'SAN', and a pull up over drive power drive signal 'SAP1', respectively, which are activated for a predetermined period, in response to an internal command signal 'BK_CMDB' at an activation time point earlier than an active pulse signal 'SA_ACTBP', and a precharge pulse signal 'SA_PCGP'. Herein, the pull up over drive power drive signal 'SAP1' is an activated signal at the activation time point of the internal command signal 'BK_CMDB'. Moreover, the active pulse signal 'SA_ACTBP' is an activated signal after a predetermined time from the active command applying time point and the precharge pulse signal 'SA_PCGP' is an activated signal after a predetermined time from the precharge command applying time point.

The power driver 120 drives the pull up drive voltage 'VINT' to the pull up power line 'RTO' in response to the pull up power drive signal 'SAP2'. Further, the power driver 120 drives the over drive voltage 'VDD' to the pull up power line 'RTO' in response to the pull up over drive power drive signal 'SAP1'. Moreover, the power driver 120 drives the pull down drive voltage 'VSS' to the pull down power line 'SB' in response to the pull down power drive signal 'SAN'. Also, the power driver precharges the pull up and pull down power lines 'RTO and SB' by the precharge voltage 'VINT/2' in response to a precharge signal 'BLEQ'.

Figure 2:
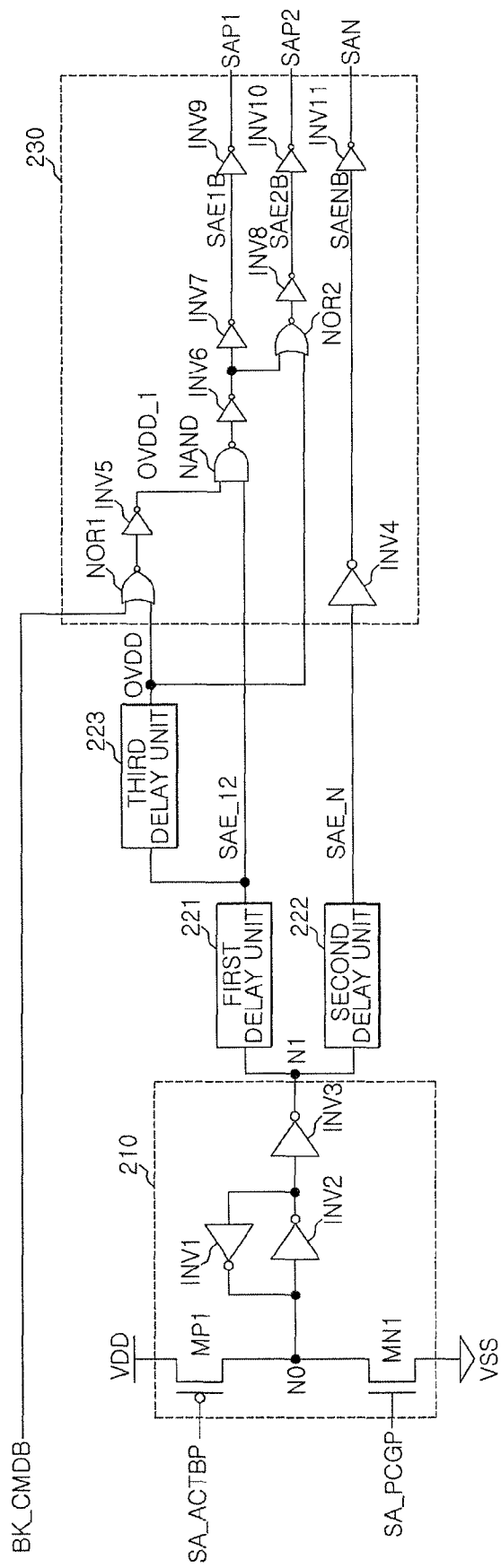
FIG. 2 is a circuit diagram of an exemplary power drive signal generator in a bit-line sense amplification power supply unit.
Figure 3:
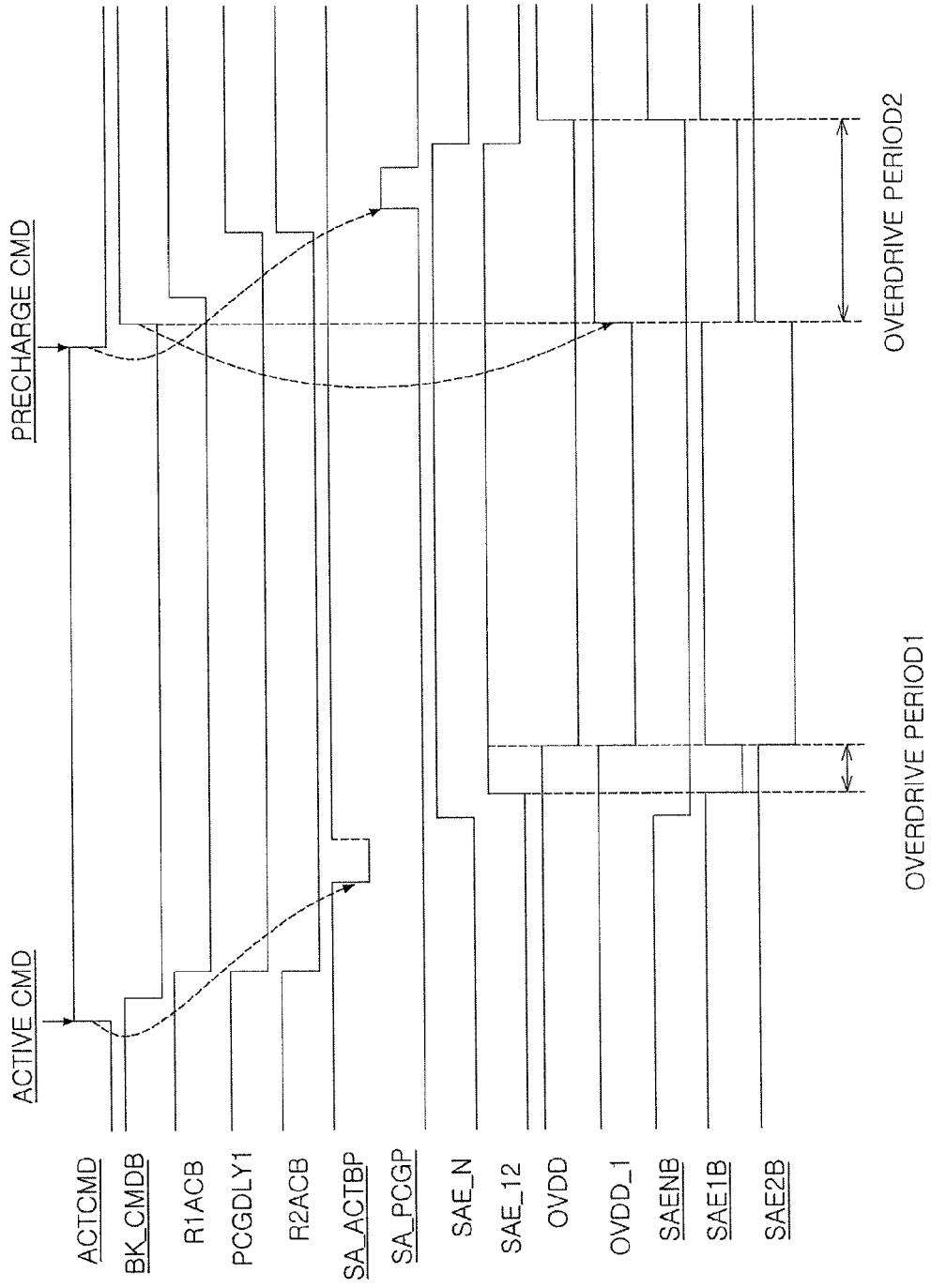
FIG. 3 is a diagram showing an exemplary timing of an internal operation of the power drive signal generator.

FIG. 2 is a circuit diagram of the exemplary power drive signal generator 110 of the bit-line sense amplification power supply unit and FIG. 3 is a timing diagram showing the internal operation of the power drive signal generator 110.

A detailed configuration and the main operations of the power drive signal generator 110 will be described with reference to FIGS. 2 and 3. Herein, 'R1ACB', 'PCGDLY1', and 'R2ACB' of the timing diagram are not directly associated with the operation of the power drive signal generator 110 and therefore, the detailed description thereof will be omitted.

The active signal 'ACTCMD' is a signal that is activated at the high level when the active command is applied and is deactivated at a low level when the precharge command is applied.

An internal command signal 'BK_CMDB' is a signal that is inverted by buffering the active signal 'ACTCMD'.

The active pulse signal 'SA_ACTBP' is a signal that is pulsed at a low level after a predetermined time from the active command applying time point.

The precharge pulse signal 'SA_PCGP' is a signal that is pulsed at a high level after a predetermined time from the precharge command applying time point. At this time, reviewing based on the precharge command applying time point, it can be appreciated that the internal command signal 'BK_CMDB' is activated at a time point earlier than the precharge pulse signal 'SA_PCGP'.

Referring to FIG. 2, the power drive signal generator 110 includes an internal control signal generator 210, a plurality of delay units 221, 222, and 223, and a signal combination unit 230.

The internal control signal generator 210 pull up and pull down-drives an output node 'N0' in response to the active pulse signal 'SA_ACTBP' and the precharge pulse signal 'SA_PCGP' to determine a voltage level of a first node 'N1'.

Each of the plurality of delay units 221, 222, and 223 delays the signals output from the first node 'N1' to output a first delay signal 'SAE_12', a second delay signal 'SAE_N', and a third delay signal 'OVDD'. The first delay unit 221 and the second delay unit 222 have a delayed value to control the difference in the activation time point of the initial pull up power drive signal 'SAP2' and pull down power drive signal 'SAN'. Further, the delay unit 223 has a delayed value to control the over drive time.

The signal combination unit 230 combines the first delay signal 'SAE_12' output from the first delay unit 221, a second delay signal 'SAE_N' output from the second delay unit 222, a third delay signal 'OVDD' output from the third delay unit 223 to output the pull up power drive signal 'SAP2', the pull down power drive signal 'SAN', and the pull up over drive power drive signal 'SAP1' that are activated for the predetermined period.

Meanwhile, the pull up power drive signal 'SAP2', the pull down power drive signal 'SAN', and the pull up over drive power drive signal 'SAP1', which are output from first to third repeaters INV9, INV10, and INV11 of the signal combination unit 230, are signals that invert each of the first internal signal 'SAE1B', the second internal signal 'SAE2B', and the third internal signal 'SA2', respectively, such that only the change in the first internal signal 'SAE1B', the second internal signal 'SAE2B', and the third internal signal 'SAENB' are shown in the timing diagram.

Referring to the timing diagram of FIG. 3, the first internal signal 'SAE1B' determining the over drive period is activated at the low level during a first over drive period (OVERDRIVE PERIOD1) and then, is activated at the low level during a second over drive period (OVERDRIVE PERIOD2) again. In particular, the second over drive period (OVERDRIVE PERIOD2) starts from the activation time point of the internal command signal 'BK_CMDB'.

Figure 4:
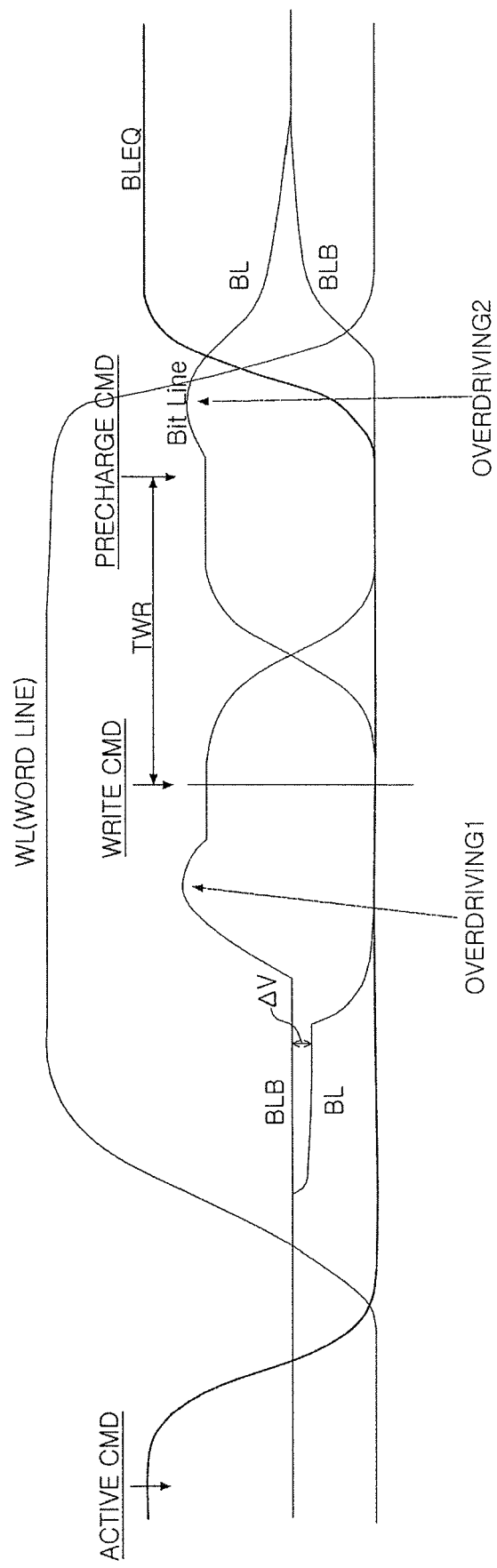
FIG. 4 is a diagram showing an exemplary voltage change of an internal signal according to an active mode of the semiconductor memory apparatus of FIG. 1.

FIG. 4 is a diagram showing a voltage change of an internal signal according to an active mode of the semiconductor memory apparatus of FIG. 1.

The change in the internal signal according to the operation mode will be described with reference to FIG. 4 and FIG. 1.

The case where the low-level data are stored in the memory cells 'MN0' and 'C' and the high-level write data are transmitted will be described.

First, when the active command 'ACTIVE CMD' is applied, the memory cell 'MN0' and 'C' are activated such that the charge share between the memory cells 'MN0' and 'C' and the positive bit-line 'BL' is generated. Since the low-level data are stored, the voltage level of the positive bit-line 'BL' falls.

Next, the bit-line sense amplifier 200 senses and amplifies the voltage difference ΔV of the bit-line pair 'BL' and 'BLB' to drive the bit-line pair 'BL' and 'BLB' by the pull up drive voltage 'VINT' and the pull down drive voltage 'VSS'. At this time, in order to shorten the amplification time, the over drive voltage 'VDD' is used. The time 'tRCD', which can apply the data write command 'WRITE CMD' from the active command applying time point through the over driving 'OVERDRIVING1', can be shortened.

Next, when the data write command 'WRITE CMD' is applied, the high-level write data is transmitted to the bit-line pair 'BL' and 'BLB', such that the voltage level of the positive bit-line 'BL' and the negative bit-line 'BLB' is inversely changed. At this time, the bit-line sense amplifier 200 drives the positive bit-line 'BL' by the pull up drive voltage 'VINT' and drives the negative bit-line 'BLB' by the pull down drive voltage 'VSS'.

Next, when the precharge command 'PRECHARGE CMD' is applied, the bit-line sense amplifier 200 drives the positive bit-line 'BC' by the over drive voltage 'VDD' until the memory cells 'MN0' and 'C' are deactivated. The time 'tWR', which can apply the precharge command 'PRECHARGE CMD' from the data write command 'WRITE CMD' by applying time point through the over driving 'OVERDRIVING2', can be shortened.

For reference, it is preferable that the activation time point of the precharge signal 'BLEQ', which is a control signal for precharging the positive bit-line 'BL' and the negative bit-line 'BLB' and precharging the pull up power line 'RTO' and the pull down power line 'SB', is controlled by tuning with the deactivation time point of the memory cells 'MN0' and 'C', that is, the deactivation time point of the word line 'WL'.

As described above, the semiconductor memory apparatus according to the embodiment is configured to transmit the data to the memory cell by the drive voltage corresponding to the data in the active mode and the data write mode and transmit the data to the memory cell by the over drive voltage having a higher voltage level than the drive voltage until the memory cell is deactivated in the precharge mode.

In other words, the bit-line sense amplifier is operated by sensing and amplifying the read data of the memory cell transmitted through the bit-line in the active mode, transmitting the data to the memory cell by the drive voltage corresponding to the read data, and transmitting the data to the memory cell by the over drive voltage having the higher voltage level than the drive voltage until the memory cell is deactivated in the precharge mode, thereby making it possible to improve the data retention time.

Further, the bit-line sense amplifier is driven by transmitting the data to the memory cell by the drive voltage corresponding to the write data in the data write mode and transmitting the data to the memory cell by the over drive voltage having the higher voltage level than the drive voltage until the memory cell is deactivated in the precharge mode, thereby making it possible to improve the time transmitting the data to the memory cell and the data retention time.

As described above, the semiconductor memory apparatus according to the embodiment improves the time when the memory cell can reliably maintain the data, that is, the data retention time.

In addition since the refresh period can be longer, the time that can access the memory cell is longer, thereby improving the performance of the semiconductor memory apparatus.

In addition, after a time point when the data write command is applied, a time 'tWR', which can apply the precharge command, can be shortened, thereby improve the data write performance.

As described above, the embodiments according to the present invention was described in detail. For reference, the embodiment, which is not directly associated with the technical spirit of the present invention but includes additional components for explaining in more detail the present invention, can be illustrated. In addition, the configuration of the active high or the active low for indicating the activation state of the signal and the circuit can be changed according to the embodiment. In addition, in order to implement the same functions, the configuration of the transistor can be changed if necessary. In other words, the configuration of the PMOS transistor and the NMOS transistor can be replaced with each other and can be implemented using various transistors if necessary. In addition, in order to implement the same functions, a configuration of a logic gate can be changed if necessary. In other words, an exclusive AND unit, an exclusive OR unit, etc., can be configured through various combinations a NAND gate, an NOR gate, an inverter, etc. The changes to the circuit are numerous and the change thereof can be easily derived from those skilled in the art and therefore, the description thereof will be omitted.

While certain embodiments have been described above, it will be understood to those skilled in the art that the embodiments described are by way of example only. Accordingly, the apparatus described herein should not be limited based on the described embodiments. Rather, the scope of the present invention is defined by the claims. All modifications and changes derived from the meanings, scope, and equivalents of the claims should be construed as being included in the scope of the present invention.

What is claimed is:

1. A semiconductor memory apparatus, comprising:
   a bit-line sense amplifier configured to sense and amplify data of bit-line pairs by driving power supplied through a pull up power line and a pull down power line and transmit the amplified data to a memory cell; and
   a bit-line sense amplification power supply unit configured to supply pull up drive voltage and pull down drive voltage to the pull up and pull down power lines in an active mode and supply an over drive voltage having a higher voltage level than the pull up drive voltage and the pull down drive voltage to the pull up and pull down power lines until the memory cell is deactivated in a precharge mode,
   wherein the bit-line sense amplification power supply unit includes a power drive signal generator configured to generate a pull up power drive signal, a pull down power drive signal, and a pull up over drive power drive signal, which are activated for a predetermined period, in response to an active pulse signal, a precharge pulse signal and an internal command signal having an activation time point earlier than the precharge pulse signal,
   wherein the active pulse signal is an activated signal after a predetermined time from an active command applying time point and the precharge pulse signal is an activated signal after a predetermined time from a precharge command applying time point.

2. The semiconductor memory apparatus of claim 1, wherein the bit-line sense amplification power supply unit supplies precharge voltage to the pull up and pull down power lines after the memory cell is deactivated in the precharge mode.

3. The semiconductor memory apparatus of claim 1, wherein the bit-line sense amplification power supply unit further includes:
   a power driver configured to drive the pull up drive voltage in response to the pull up power drive signal, drive the over drive voltage in response to the pull up over drive power drive signal, and drive the pull down drive voltage in response to the pull down power drive signal,
   the pull up over drive power drive signal being activated at the activation time point of the internal command signal.

4. A semiconductor memory apparatus, comprising:
   a bit-line sense amplifier configured to sense and amplify data of bit-line pairs by driving power supplied through a pull up power line and a pull down power line and transmit the amplified data to a memory cell; and
   a bit-line sense amplification power supply unit configured to supply pull up drive voltage and pull down drive voltage to the pull up and pull down power lines in a data write mode and supply an over drive voltage having a higher voltage level than the pull up drive voltage and the pull down drive voltage to the pull up and pull down power lines until the memory cell is deactivated in a precharge mode,
   wherein the bit-line sense amplification power supply unit includes a power drive signal generator configured to generate a pull up power drive signal, a pull down power drive signal, and a pull us over drive power drive signal which are activated for a predetermined period in response to an active pulse signal, a precharge pulse signal and an internal command signal having an activation time point earlier than the precharge pulse signal,
   wherein the active pulse signal is an activated signal after a predetermined time from an active command applying time point and the precharge pulse signal is an activated signal after a predetermined time a precharge command applying time point.

5. The semiconductor memory apparatus of claim 4, wherein the bit-line sense amplification power supply unit supplies a precharge voltage to the pull up and pull down power lines after the memory cell is deactivated in the precharge mode.

6. The semiconductor memory apparatus of claim 4, wherein the bit-line sense amplification power supply unit further includes:
   a power driver configured to drive the pull up drive voltage in response to the pull up power drive signal, drive the over drive voltage in response to the pull up over drive power drive signal, and drive the pull down drive voltage in response to the pull down power drive signal,
   the pull up over drive power drive signal being activated at the activation time point of the internal command signal.

* * * * *